(12) United States Patent
Hamren

(10) Patent No.: US 6,543,512 B1
(45) Date of Patent: *Apr. 8, 2003

(54) CARRIER, METHOD AND SYSTEM FOR HANDLING SEMICONDUCTOR COMPONENTS

(75) Inventor: Steven L. Hamren, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/181,789

(22) Filed: Oct. 28, 1998

(51) Int. Cl.⁷ ............................................. B65D 85/86
(52) U.S. Cl. .................... 156/540; 156/541; 206/714; 206/716
(58) Field of Search ................. 156/230, 232, 156/297, 299, 344, 552, 247, 249, 538, 539, 540, 541, 584; 438/106, 113; 206/714, 716

(56) References Cited

U.S. PATENT DOCUMENTS

| | | | | |
|---|---|---|---|---|
| 5,089,314 A | * | 2/1992 | Masujima et al. | 206/713 |
| 5,141,790 A | | 8/1992 | Calhoun et al. | 428/40 |
| 5,152,393 A | * | 10/1992 | Chenoweth | 206/714 |
| 5,378,536 A | | 1/1995 | Miller et al. | 428/355 |
| 5,389,438 A | | 2/1995 | Miller et al. | 428/355 |
| 5,476,566 A | * | 12/1995 | Cavasin | 156/249 |
| 5,534,102 A | * | 7/1996 | Kadono et al. | 156/250 |
| 5,576,936 A | * | 11/1996 | Brorby | 361/796 |
| 5,620,928 A | * | 4/1997 | Lee et al. | 438/118 |
| 5,622,900 A | * | 4/1997 | Smith | 438/464 |
| 5,629,063 A | | 5/1997 | Gobran | 428/40.1 |
| 5,667,073 A | * | 9/1997 | Okui | 206/713 |
| 5,696,032 A | | 12/1997 | Phelps, Jr. et al. | 437/209 |
| 5,727,310 A | | 3/1998 | Casson et al. | 29/830 |
| 5,769,237 A | * | 6/1998 | Althouse et al. | 206/460 |
| 5,852,870 A | * | 12/1998 | Freyman et al. | 29/841 |
| 5,985,695 A | * | 11/1999 | Freyman et al. | 438/112 |
| 6,054,008 A | * | 4/2000 | Chan et al. | 156/247 |
| 6,136,137 A | | 10/2000 | Farnworth et al. | |
| 6,235,387 B1 | | 5/2001 | Bennett et al. | |
| 6,319,354 B1 | | 11/2001 | Farnworth et al. | |
| 6,357,594 B1 | * | 3/2002 | Gutentag | 206/460 |

OTHER PUBLICATIONS

Landrock, Arthur H., Adhesives Technology Handbook, Noyes Publications, 1985. pp. 60–61.*

Shields, J. Adhesives Handbook, CRC Pressm 1970. pp. 235–236.*

* cited by examiner

Primary Examiner—Michael W. Ball
Assistant Examiner—John T. Haran
(74) Attorney, Agent, or Firm—Stephen A. Gratton

(57) ABSTRACT

A carrier for semiconductor components, and a method and system for handling semiconductor components using the carrier, are provided. The carrier includes a frame having component mounting sites that include adhesive members for retaining the components on the carrier. The adhesive members can include one or more pieces of polymer tape having low tack adhesive surfaces for retaining the components, and high tack adhesive surfaces for bonding to the carrier. The low tack adhesive surfaces are formulated to provide adhesive forces sufficient to retain the components on the component mounting sites, but low enough to allow a conventional pick and place vacuum tool to remove the components from the carrier. The adhesive forces on the components are determined by a contact area between the components and low tack adhesive surfaces, and by adhesive qualities of the low tack adhesive surfaces.

29 Claims, 7 Drawing Sheets

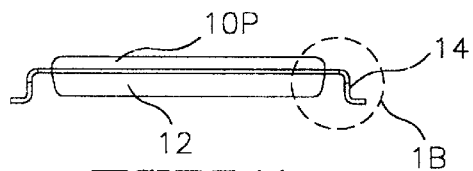
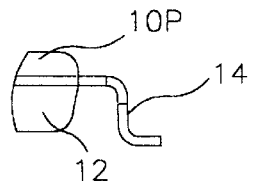
FIGURE 1A (PRIOR ART)
FIGURE 1B (PRIOR ART)
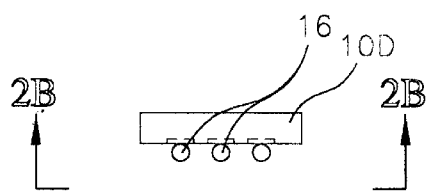
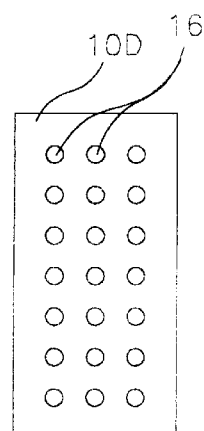
FIGURE 2A (PRIOR ART)
FIGURE 2B (PRIOR ART)
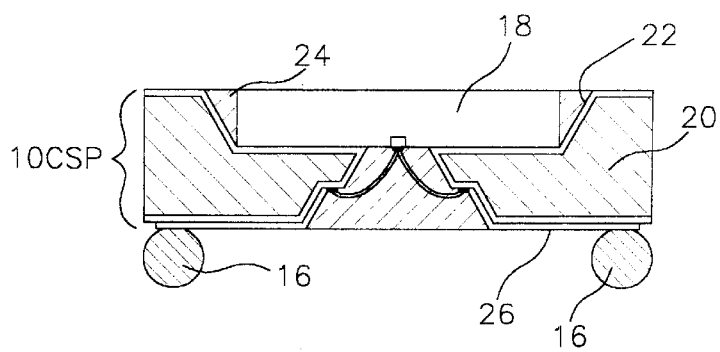
FIGURE 3 (PRIOR ART)
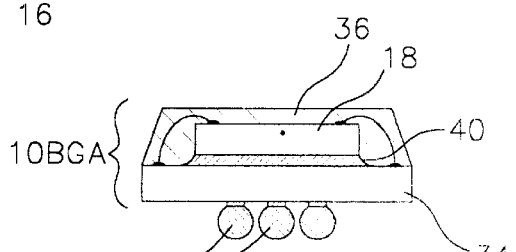
FIGURE 4 (PRIOR ART)
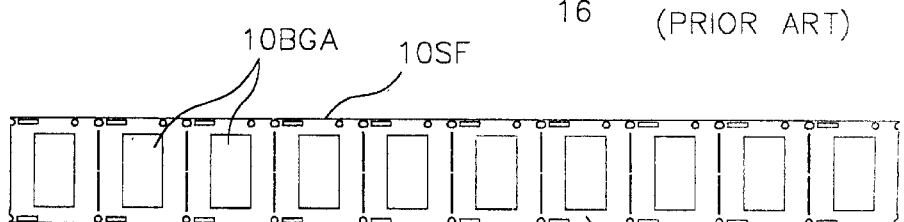
FIGURE 4A (PRIOR ART)

```
┌─────────────────────────────────────────────────────┐
│ PROVIDING A CARRIER COMPRISING A FRAME HAVING AN    │
│ ARRANGEMENT OF COMPONENT MOUNTING SITES             │
└─────────────────────────────────────────────────────┘
                          │
┌─────────────────────────────────────────────────────┐
│ PROVIDING ADHESIVE MEMBERS ON THE COMPONENT         │
│ MOUNTING SITES COMPRISING PIECES OF POLYMER         │
│ TAPE HAVING LOW TACK ADHESIVE SURFACES FOR          │
│ RETAINING THE COMPONENTS AND HIGH TACK              │
│ ADHESIVE SURFACES FOR BONDING TO THE FRAME          │
└─────────────────────────────────────────────────────┘
                          │
┌─────────────────────────────────────────────────────┐
│           PLACING THE COMPONENTS ON                 │
│           THE ADHESIVE MEMBERS                      │
└─────────────────────────────────────────────────────┘
                          │
┌─────────────────────────────────────────────────────┐
│ HANDLING OR TRANSPORTING THE COMPONENTS             │
│ USING THE CARRIER, WITH THE COMPONENTS              │
│ RETAINED ON THE ADHESIVE MEMBERS                    │
└─────────────────────────────────────────────────────┘
                          │
┌─────────────────────────────────────────────────────┐
│ REMOVING THE COMPONENTS FROM THE COMPONENT          │
│ MOUNTING SITES USING CONVENTIONAL VACUUM TOOLS      │
└─────────────────────────────────────────────────────┘
```

FIGURE 8

CARRIER, METHOD AND SYSTEM FOR HANDLING SEMICONDUCTOR COMPONENTS

FIELD OF THE INVENTION

This invention relates generally to semiconductor manufacture and specifically to the handling of semiconductor components including packages, chip scale packages, BGA devices, and bare semiconductor dice.

BACKGROUND OF THE INVENTION

Semiconductor components are becoming smaller and lighter. Chip scale packages (CSP), for example, have a peripheral outline that is slightly larger than that of an unpackaged die. A footprint for a typical chip scale package is only about 1.2 times the size of the die contained within the package. In addition, the weight of a typical chip scale package is about the same as an unpackaged die. Other types of semiconductor components, such as conventional plastic packages (e.g., TSOP, SOJ, LCC), BGA devices (e.g., $\mu$BGA and FBGA devices), and "strip form" devices are also becoming smaller and lighter. These smaller and lighter semiconductor components are more difficult to handle and transport during various processes such as testing, marking, packaging and assembly on circuit boards and electronic devices.

Typically, small semiconductor components are transported between various manufacturing and packaging operations in carriers. One type of carrier used widely in the industry includes a molded plastic frame having separate mounting sites for the components. These types of carriers are manufactured by different manufacturers such as Fluoroware of Minneapolis, Minn.

Typically, the frames for this type of carrier can be stacked for enclosing and protecting the components. In addition, the frames can have a "standard" peripheral configuration, and "standard" features that permit handling by standard equipment, such as magazines and conveyor tracks. The standard features can include lugs, recesses, chamfers and other features formed integrally with the frame. One type of standard carrier is constructed according to JEDEC (Joint Electron Device Engineering Council) standards, and is known as a JEDEC carrier.

On some types of carriers the components merely rest on the mounting sites and are restrained from movement only in the X and Y directions. The mounting sites, for example, can comprise molded tabs that engage the corners or sides of the components, or alternately pockets having peripheral outlines matching that of the components. Movement in the Z-direction is not restrained, so that the carrier must be maintained in an upright position to prevent the components from becoming dislodged from the mounting sites. Also to prevent dislodging of components, the process equipment for handling the carriers must be designed to minimize rough handling and movement of the carriers. In addition, personnel handling the carriers must be careful not to dislodge the components from the mounting sites during handling of the carriers.

Other types of carriers utilize a retention mechanism to physically engage and hold the component on the mounting site. These types of carriers are manufactured by Advantest of Japan and Aetrium of St. Paul, Minn. A representative retention mechanism includes spring loaded tabs that latch the edges of the component as it is held in a pocket. With these carriers, the frame can comprise molded plastic, or another electrically insulating material, such as ceramic or glass filled resin.

One problem with this type of carrier is that the retention mechanism complicates the design of the carrier, and requires the carrier to be larger, heavier and more expensive. In addition, specialized equipment is required to actuate and unactuate the retention mechanisms, and to load and unload the components from the mounting sites. Further, the components can be damaged due to misalignment during loading and unloading, and can also be damaged should they become dislodged. Bent leads, and deformed solder balls, are examples of damage that can occur to components due to misalignment or dislodging in a carrier.

Still another type of carrier includes a plastic frame and an elastomeric membrane formulated to provide a releasable adhesive surface. Sometimes rather than having separate mounting sites, the frame and elastomeric membrane can accommodate various components having different sizes and shapes. Representative elastomeric membrane materials include silicone, polyurethane, thermoplastic elastomers and polyimide. This type of carrier is manufactured by Vichem Corporation, of Sunnyvale, Calif. under the trademark "GEL-PAK". Although the components are lightly restrained by the elastomeric material, this type of carrier is not suitable for some applications in which the components must be totally restrained in the Z-direction.

The present invention is directed to an improved carrier in which the components are retained by a low tack adhesive member on the component mounting sites. The carrier can be made smaller, lighter and cheaper than carriers having retention mechanisms, and does not require specialized handling equipment.

SUMMARY OF THE INVENTION

In accordance with the present invention, an improved carrier for semiconductor components is provided. Also provided are an improved semiconductor handling system employing the carrier, and an improved method for handling semiconductor components using the carrier.

The carrier, simply stated, comprises: a frame having a plurality of component mounting sites; and adhesive members formed on the component mounting sites for retaining the components on the carrier. The adhesive members are configured to exert a first adhesive force for retaining the components on the carrier, and a second adhesive force for bonding to the carrier.

In an illustrative embodiment, the adhesive members comprise pieces of polymer tape having an inner surface covered with a high tack adhesive layer, and an outer surface covered with a low tack adhesive layer. The high tack adhesive layers are formulated to provide semi permanent attachment of the polymer tape to the frame. The low tack adhesive layers are formulated to retain the components on the component mounting sites during normal handling of the carrier, but to allow removal of the components from the component mounting sites using conventional tools (e.g., pick and place vacuum tools).

The adhesive forces exerted by the adhesive members on the components are determined by the size of contact areas with the components, and by the adhesive qualities of the low tack adhesive layers. In a similar manner the adhesive forces exerted by the adhesive members on the frame are determined by the size of contact areas with the frame, and by the adhesive qualities of the high tack adhesive layers. Accordingly, the contact areas and adhesive qualities can be adjusted as required to achieve desired adhesive forces on the component and frame.

The polymer tape can comprise polyimide, polyethylene or polypropylene, on which the high tack adhesive layer, and the low tack adhesive layer can be formed using a suitable deposition process (e.g., spraying, printing, stenciling). The high tack adhesive layer can comprise a pressure activated adhesive, a heat activated adhesive, or a curable adhesive such as an epoxy, acrylic or silicone. The low tack adhesive can comprise a repositionable pressure sensitive adhesive.

In an alternate embodiment the adhesive members comprise a low tack adhesive layer that is sprayed, cast in place, or otherwise formed, on topographical features of the frame, such as indentations, ridges or serrations. The topographical features are configured to provide an increased surface area for adherence of the low tack adhesive layer to the frame. In another alternate embodiment the adhesive members comprise a low tack adhesive layer cast in place, or otherwise formed, on a priming layer formed on the frame. The priming layer is configured to increase the adhesion of the low tack adhesive layer to the frame.

In the illustrative embodiment the frame comprises molded plastic, and has a peripheral configuration and external features constructed according to standards of an industry standard setting body, such as JEDEC. Standardized equipment, such as magazines and conveyor tracks, can thus be used for transporting and handling the frame, with the components retained thereon. The frame also includes stacking ridges that permit stacking of multiple frames.

Preferably the component mounting sites are formed integrally with the frame using a molding process. The component mounting sites can be configured to retain a particular type of component, such as a semiconductor package, a chip scale package, a ball grid array device, an unpackaged semiconductor die, or a strip form device. The component mounting sites can comprise ridges, tabs, or pockets, which correspond in size to peripheral features of the components, such as terminal leads, edge surfaces, or end surfaces thereof. In addition, the component mounting sites can be configured to retain the components in a "live bug" position wherein the component leads are down, or in a "dead bug" position wherein the component leads are up.

The semiconductor handling system includes the carrier and a conventional pick and place vacuum tool. The vacuum tool is configured to exert a force on the components for removing the components from the adhesive members. The force exerted by the vacuum tool is greater than the adhesive force of the adhesive members on the components, but less than the adhesive force of the adhesive members on the carrier.

The method for handling semiconductor components includes the steps of: providing a carrier comprising a frame having an arrangement of component mounting sites; providing adhesive members on the component mounting sites comprising pieces of polymer tape having low tack adhesive surfaces for retaining the components and high tack adhesive surfaces for bonding to the frame; placing the components on the adhesive members; handling or transporting the components using the carrier, with the components retained on the adhesive members; and then removing the components from the component mounting sites using conventional vacuum tools.

BRIEF DESCRIPTION OF THE DRAWINGS

FIG. 1A is an enlarged side elevation view of a prior art semiconductor component in the form of a semiconductor package;

FIG. 1B is an enlarged portion of FIG. 1A taken along section line 1B illustrating a detail of the semiconductor package;

FIG. 2A is an enlarged side elevation view of a prior art semiconductor component in the form of an unpackaged bumped semiconductor die;

FIG. 2B is a bottom view of the die taken along section line 2B—2B of FIG. 2A;

FIG. 3 is an enlarged cross sectional view of a prior art semiconductor component in the form of a chip scale package;

FIG. 4 is an enlarged cross sectional view of a prior art semiconductor component in the form of a BGA device;

FIG. 4A is a schematic plan view of a prior art semiconductor component in the form of a strip form device;

FIG. 7B-2 is an enlarged portion of the component mounting site equivalent to FIG. 7B-1 but showing the component in a "dead bug" position;

FIG. 8 is a block diagram illustrating steps in a method for retaining a semiconductor component in accordance with the invention;

DETAILED DESCRIPTION OF THE PREFERRED EMBODIMENTS

Figure 5A:
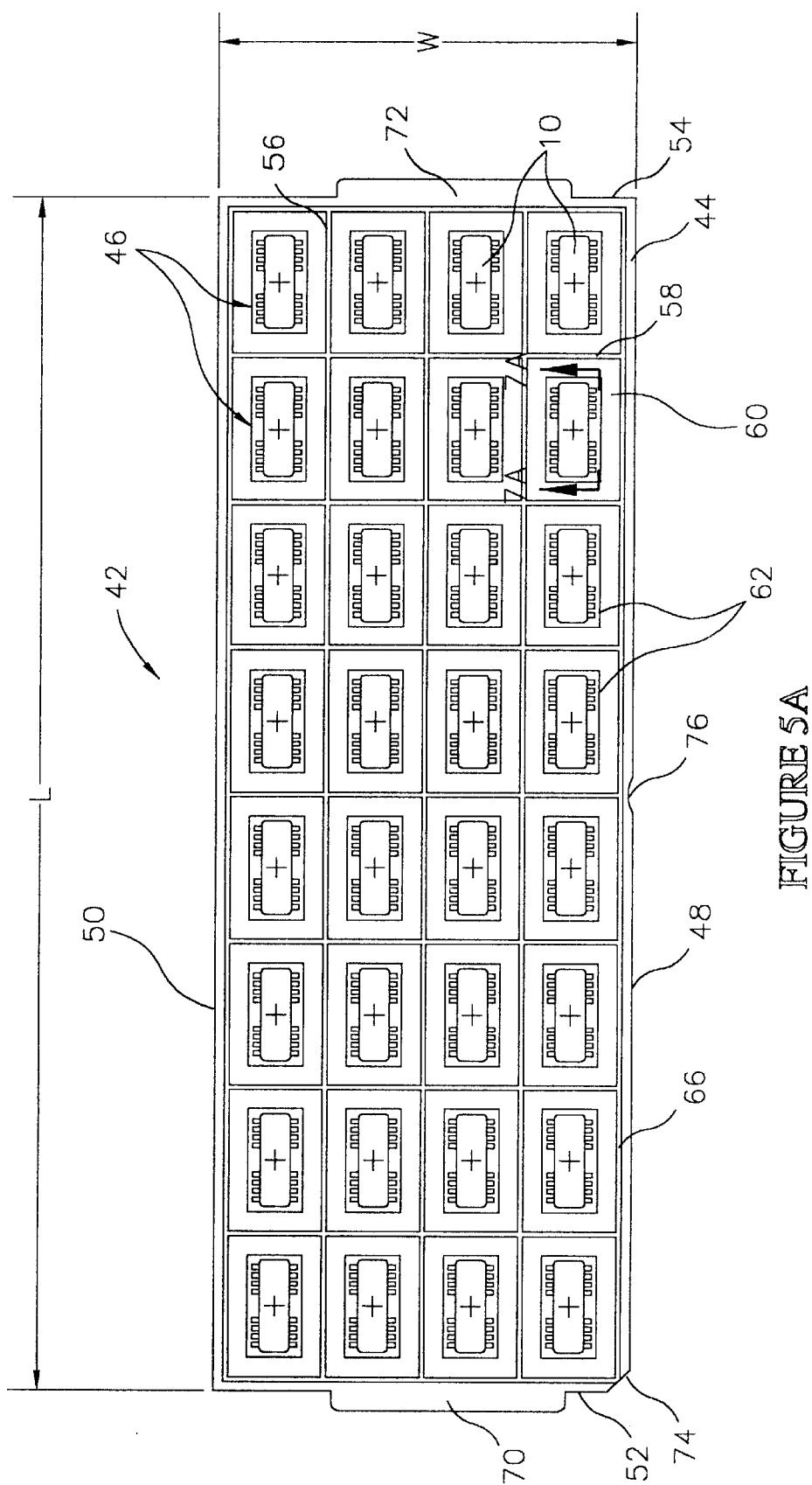
FIG. 5A is a plan view of a low density carrier constructed in accordance with the invention.

Referring to FIGS. 1A–1B, 2A–2B, 3 and 4, various prior art semiconductor components suitable for use with a carrier constructed in accordance with the invention are illustrated.

In FIGS. 1A and 1B, a semiconductor component in the form of a semiconductor package 10P is illustrated. The semiconductor package 10P includes a plastic body 12 which encapsulates a semiconductor die (not shown). The package 10P also includes dual rows of terminal leads 14 in electrical communication with the integrated circuits contained on the die.

The semiconductor package 10P is in the configuration of a conventional thin small outline package (TSOP). However, it is to be understood that the invention can be practiced with other types of conventional plastic and ceramic packages including DIP (dual in line package), ZIP (zig zag in line package), LCC (leadless chip carrier), SOP (small outline package), QFP (quad flat pack), SOJ (small outline J-bend), PGA (pin grid array), LGA (land grid array) and BGA (ball grid array) packages.

FIGS. 2A and 2B illustrate a prior art component in the form of a bumped semiconductor die 10D. The die 10D includes contact balls 16 in electrical communication with the integrated circuits formed on the die 10D and arranged in a ball grid array. The invention can also be practiced with a semiconductor die having planar bond pads rather than contact balls 16.

FIG. 3 illustrates another prior art semiconductor component in the form of a chip scale package 10CSP. The chip scale package 10CSP includes a silicon body 20 having a recess 22 wherein a semiconductor die 18 is held by an encapsulant 24. The chip scale package 10CSP also includes conductors 26 wire bonded to the die 18. The conductors 26 are in electrical communication with contact balls 16. Further details of the chip scale package 10CSP are described in U.S. Pat. No. 5,674,785 to Akram et al. entitled "Method Of Producing A Single Piece Package For Semiconductor Die", and in U.S. Pat. No. 5,739,585, to Akram et al. entitled "Single Piece Package For Semiconductor Die", both of which are incorporated herein by reference. The invention can also be practiced with other types of chip scale packages.

FIG. 4 illustrates another prior art component in the form of a BGA device 10BGA. The BGA device 10BGA includes a semiconductor die 18, and a BGA substrate 34. The die 18 is wire bonded to the BGA substrate 34 in electrical communication with contact balls 16 on the BGA substrate 34. In addition, an adhesive layer 40 attaches the BGA substrate 34 to the die 18, and an encapsulant 36 covers the die 18 and associated wire bonds. The invention can also be practiced with other types of BGA devices.

FIG. 4A illustrates another prior art component in the form of a strip form device 10SF. The strip form device 10SF includes multiple BGA devices 10BGA that have been fabricated on a lead frame 35, but have not been singulated from the lead frame 35.

Referring to FIG. 5A, a carrier 42 constructed in accordance with the invention is illustrated. The carrier 42 includes a frame 44, and a plurality of separate component mounting sites 46 on the frame 44. In the illustrative embodiment, the component mounting sites 46 are configured to retain a semiconductor component 10 which comprises a semiconductor package. However, the component mounting sites 46 can be configured to retain unpackaged semiconductor dice 10D (FIG. 2A), chip scale packages 10CSP (FIG. 3), BGA devices 10BGA (FIG. 4), or strip form devices 10SF (FIG. 4A), as well as other types of semiconductor components.

Figure 5B:
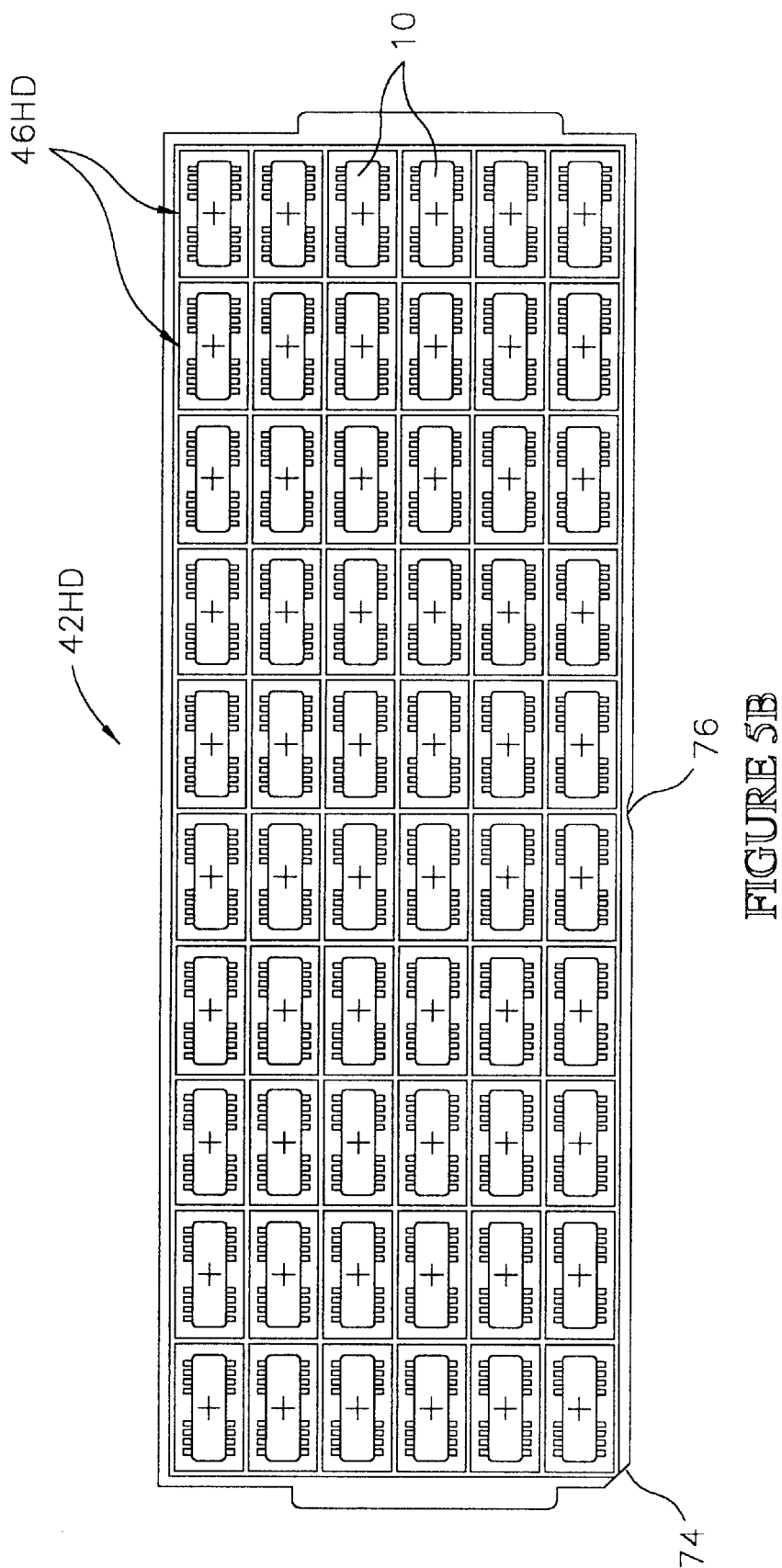
FIG. 5B is a plan view of an alternate embodiment high density carrier constructed in accordance with the invention.

Also in the illustrative embodiment, the carrier 42 has a low density of mounting sites 46 relative to the total surface area of the carrier 42. Low density carriers are used for handling components for various manufacturing operations such as testing, marking and inspection. However, the carrier 42 can also be configured as a high density carrier suitable for high density applications, such as packaging and shipping. FIG. 5B illustrates an alternate embodiment carrier 42HD constructed substantially the same as carrier 42 (FIG. 5A) but with high density component mounting sites 46HD.

Figure 6A:
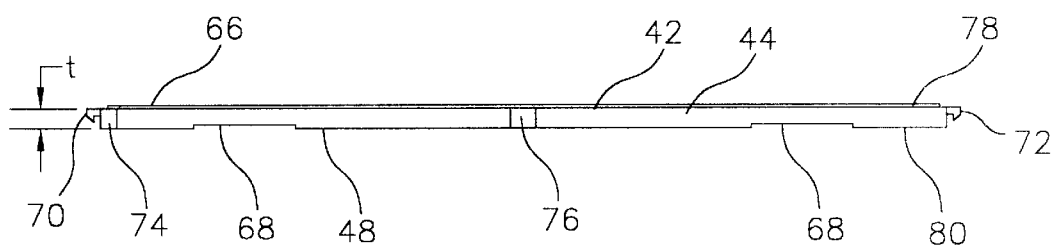
FIG. 6A is a side elevation view of the carrier of FIG. 5A illustrating further details of the carrier.

Referring again to FIG. 5A, the frame 44 is a generally rectangular shaped member having a length L, a width W and a thickness t (FIG. 6A). These dimensions, along with other features of the frame 44 to be hereinafter described, can be constructed according to standards of an industry standard setting body, such as JEDEC (Joint Electron Device Engineering Council).

In addition, the frame 44 can be formed as a one piece plastic member using an injection molding process. Suitable plastics for the frame 44 include thermoplastic plastics, thermosetting plastics and liquid crystal polymers. Exemplary plastics include polyetherimide (PEI) and polyphenyl sulfide (PPS). The frame 44 can also include a carbon filler, or a metal layer (not shown), to provide electrical conductivity, and electrostatic discharge (ESD) protection for the semiconductor packages 10P.

The frame 44 includes parallel spaced side rails 48, 50 and parallel spaced end rails 52, 54. In addition, the frame 44 includes separation ribs 56, 58, that along with the side rails 48, 50 and end rails 52, 54 define the boundaries of the separate component mounting sites 46. The frame 44 also includes a solid lower wall 60 in which a plurality of pockets 62 are formed. Each pocket 62 has a peripheral outline that is slightly larger than a peripheral outline of the components 10.

Figure 6B:
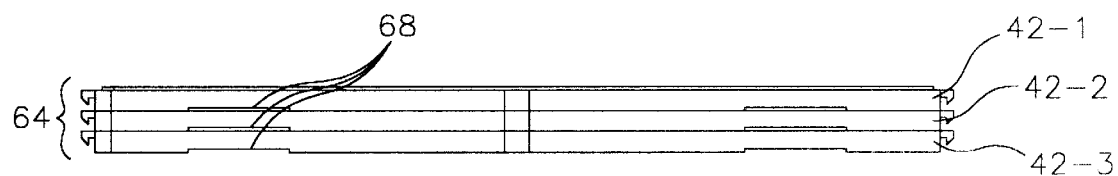
FIG. 6B is a side elevation view of multiple carriers in a stacked configuration.

As shown in FIGS. 6A and 6B, the carrier 42 can be designed for stacking with identical carriers on either side. FIG. 6B illustrates a stack 64 of carriers 42-1, 42-2, 42-3. Stacking ridges 66 are formed on a first side 78 of the frame 44, and are molded integrally on the surfaces of the side rails 48, 50 and end rails 52, 54. In addition, the stacking ridges 66 can be formed continuously with the separation ridges 56, 58. The stacking ridges 66 have an outer peripheral outline that corresponds in size and shape to an inner peripheral outline of the side rails 48, 50 and end rails 52, 54 on an opposing second side 80 the frame 44. In addition, cut outs 68 are formed in the side rails 48, 50 to facilitate separation of the stacked carriers 42-1, 42-2, 42-3.

The frame 44 also includes a lug 70 (FIG. 6A) on end rail 52, and a lug 72 (FIG. 6A) on end rail 54. The lugs 70, 72 have a standardized configuration that permits handling of the carrier 42 by standard equipment. In addition, the frame 44 includes a chamfered surface 74 (FIG. 6A) formed on end rail 52. The chamfered surface 74 can be used to indicate an orientation of the carrier 42. Also, a convex scallop 76 formed in side rail 48 can be used for engaging a pin to mechanically bias orientation of the carrier 42.

Figure 7A:
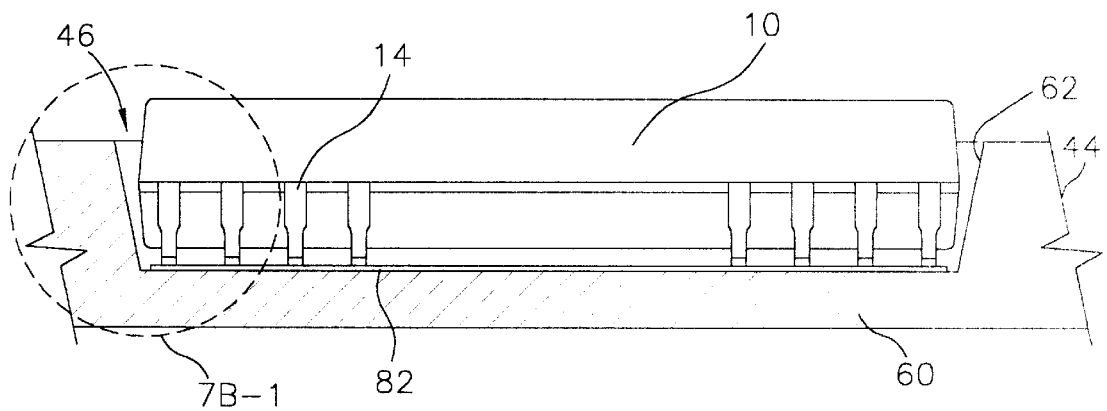
FIG. 7A is a cross sectional view taken along section line 7A—7A of FIG. 5A illustrating a component mounting site on the carrier and a component retained on the component mounting site in a "live bug" position.
Figures 1, 7B:
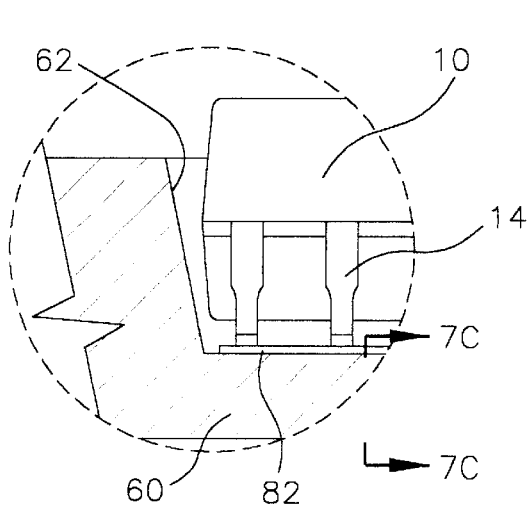
FIG. 7B-1 is an enlarged portion of the component mounting site taken along section line 7B-1 of FIG. 7A.
Figures 2, 7B:
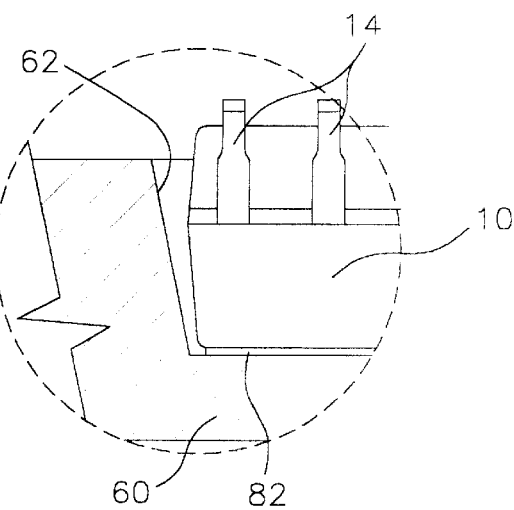
Figure 7C:
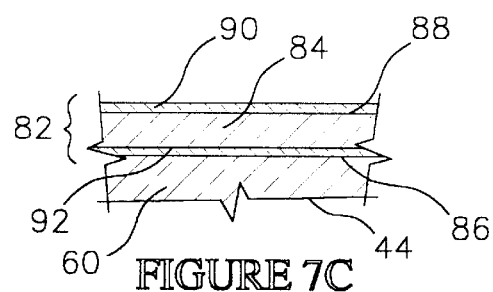
FIG. 7C is an enlarged cross sectional view taken along section line 7C—7C of FIG. 7B illustrating an adhesive member of the component mounting site.

Referring to FIGS. 7A–7C, further details of the carrier 42 are illustrated. Each component mounting site 46 includes an adhesive member 82 configured to retain the component 10 on the mounting site 46. A size and shape of the adhesive member 82 can correspond to a size and shape of the component 10. Alternately, the adhesive member 82 can have a geometrical configuration (e.g., square, rectangular, circular) that is different than a shape of the component 10P. In addition, the adhesive member 82 can have a particular geometrical configuration for contacting different surfaces or features of the component 10. Further, each component mounting site 46 can include a single adhesive member 82, or two or more adhesive members 82.

In the embodiment illustrated in FIG. 7C, the adhesive member 82 comprises a polymer tape 84 (FIG. 7C) having an inner surface 86 covered with a high tack adhesive layer 92 (FIG. 7C), and an outer surface 88 covered with a low tack adhesive layer 90 (FIG. 7C).

One suitable material for the polymer tape 84 comprises polyimide. Polyimide tape is commercially available under the trademarks "KAPTON" tape and "UPLEX" tape. Other suitable materials for the polymer tape 84 include polyethylene, and polypropylene. A representative thickness of the polymer tape 84 can be from about 1 mil or less to 7 mils.

The high tack adhesive layer 92 comprises an aggressively tacky adhesive formulated to provide strong bonds with the lower wall 60 of the frame 44. In particular, the bonds must be sufficient to resist detachment of the adhesive member 82 during normal use of the carrier 42, and detachment during removal of the component 10 from the component mounting sites 46. Preferably, the high tack adhesive layer 92 is formulated to exert an adhesive force on the frame 44 that is at least several times greater than an adhesive force of the low tack adhesive layer 90 on the component 10.

The high tack adhesive layer 92 can comprise a pressure sensitive adhesive, a temperature sensitive adhesive, or a curable adhesive. Suitable adhesives for the high tack adhesive layer 92 include polydimethyl-siloxane adhesives, phenyl-siloxane adhesives, epoxy adhesives, acrylic adhesives, silicone containing adhesives, and cyanoacrylate adhesives. Depending on the adhesive, a representative thickness of the high tack adhesive layer 92 can be from 1 mils to 7 mils. The high tack adhesive layer 92 can be formed on the polymer tape 84 using a suitable deposition process such as spraying, printing or stenciling.

Still referring to FIG. 7C, the low tack adhesive layer 90 is formulated to exert an adhesive force for retaining the component 10 on the component mounting site 46 during normal handling of the carrier 42. The adhesive force is a function of the contact area between the component 10 and low tack adhesive layer 90. In FIG. 7B-1 the component is retained on the adhesive member 82 in a "live bug" position (e.g., leads 14 facing down). In this position the contact area is formed by the terminal leads 14 of the component 10 resting on the adhesive member 82. Alternately other portions of the component can be in contact with the adhesive member 82. For example, in FIG. 7B-2 the component 10 is retained on the adhesive member 82 in a "dead bug" position (e.g., leads 14 facing up). In this case a planar surface of a plastic body of the component 10 rests on the adhesive member 82. For some components, such as chip scale package 10CSP, the contact area can be determined by contact of the contact balls 16, or other features of the components, with the low tack adhesive layer 90.

A geometrical shape, position and surface area of the adhesive member 82 can also be adjusted to achieve a required adhesive force. In addition, the adhesive force is a function of the adhesive qualities of the low tack adhesive layer. Accordingly, the adhesive qualities of the low tack adhesive layer 90 can be adjusted to obtain a desired adhesive force.

Preferably the low tack adhesive layer 90 restrains the component 10 in the X, Y and Z directions even with a 180° rotation of the carrier 42. However, at the same time, the low tack adhesive layer 90 is formulated to allow the component 10 to be easily removed from the component mounting site 46 using conventional semiconductor handling tools, such as vacuum pick and place tools.

Suitable adhesives for the low tack adhesive layer 90 are commercially available from 3M Company, Saint Paul, Minn. under the trademarks "REMOUNT REPOSITIONABLE ADHESIVE", and "SPRAY MOUNT ARTIST'S ADHESIVE". These adhesives are available in aerosol containers, and can be sprayed, printed, stenciled or otherwise deposited on the polymer tape 84 to a desired thickness.

A representative thickness of the low tack adhesive layer 90 can be from about 1 mil or less to 7 mils.

Low tack adhesives known as "repositionable adhesives" can also be formulated as described in U.S. Pat. Nos. 5,389,438 and 5,378,536; both of which are incorporated herein by reference. These patents describe a low tack adhesive comprising from 20 to 80 parts of at least one elastomeric block copolymer selected from styrene/butadiende, styrene/isoprene, and styrene/ethylene-butylene block copolymers, and from 80 to 20 parts of a tackifying material selected from tackifier resins or blends, or blends of tackifier resin with liquid plasticizer oil. This type of low tack adhesive has been used to fabricate disposable diapers, and paper products, such as "POST IT" notes manufactured by 3M.

Depending on the adhesive, the low tack adhesive layer 90 can be formulated to exert an adhesive force on the component 10 of about 0.2 grams/mm$^2$ to 1.5 grams/mm$^2$. Accordingly, for a component having a contact area of about 20 mm$^2$ the low tack adhesive layer 90 can be formulated to exert an adhesive force of about 4 grams to 30 grams. The adhesive force of the low tack adhesive layer 90 can also be expressed as a peel value. A representative 90° peel value is from 2 N/25 mm to 8 N/25 mm (where N is a Newton).

Figure 7D:
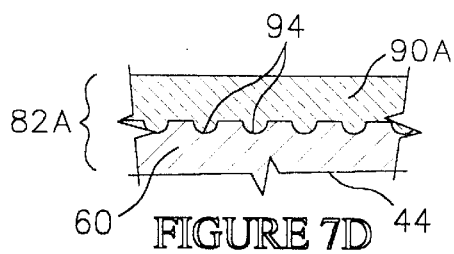
FIG. 7D is an enlarged cross sectional view equivalent to FIG. 7C of an alternate embodiment component mounting site.

Referring to FIG. 7D, an alternate embodiment adhesive member 82A is illustrated. Adhesive member 82A comprises a low tack adhesive layer 90A that is sprayed, cast in place, or otherwise formed, on the lower wall 60 of the frame 44. Any of the adhesive materials previously described for the low tack adhesive layer 90 can be deposited directly on the frame 44 to a desired thickness to form the low tack adhesive layer 90A. The low tack adhesive layer 90A is formulated to releaseably retain the component 10P substantially as previously described for low tack adhesive layer 90. However, in this embodiment, the frame 44 includes topographical features 94, such as indentations, ridges, serrations, or embossed members that provide an increased surface area on the frame 44. The topographical features 94 permit the low tack adhesive layer 90A to adhere to the frame with an adhesive force that is greater than the adhesive force exerted on the component 10P. Also in this embodiment, rather than being cast in place, the adhesive member 82A can comprise a polymer tape with inner and outer adhesive layers thereon substantially as previously described for adhesive member 82.

Figure 7E:
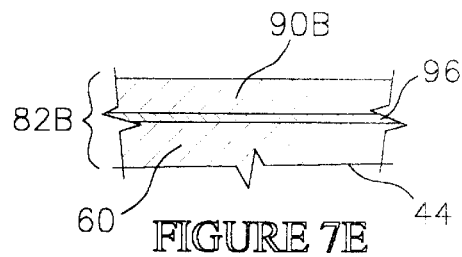
FIG. 7E is an enlarged cross sectional view equivalent to FIG. 7C of another alternate embodiment component mounting site.

Referring to FIG. 7E, another alternate embodiment adhesive member 82B is illustrated. Adhesive member 82B comprises a low tack adhesive layer 90B that is sprayed, cast in place, or otherwise formed, on a priming layer 96 formed on the frame 44. Any of the adhesive materials previously described for the low tack adhesive layer 90 can be used to form the low tack adhesive layer 90B.

In each of the above carrier embodiments, the adhesive member can be reused multiple times in a production environment for handling multiple semiconductor components 10. However, when contaminants collect on the low tack adhesive layers 90 the adhesive members 82 can be replaced. In addition, each of the above carrier embodiments can be utilized with conventional handling equipment such as conventional pick and place equipment. Still further, the carriers can be made in either a low density or a high density configuration, and do not require complex and expensive retention mechanisms.

Referring to FIG. 8, broad steps in a method for handling semiconductor components in accordance with the invention are illustrated.

A. Providing a carrier comprising a frame having an arrangement of component mounting sites.

B. Providing adhesive members on the component mounting sites comprising pieces of polymer tape having low tack adhesive surfaces for retaining the components and high tack adhesive surfaces for bonding to the frame.

C. Placing the components on the adhesive members.

D. Handling or transporting the components using the carrier, with the components retained on the adhesive members.

E. Removing the components from the component mounting sites using conventional vacuum tools.

Figure 9A:
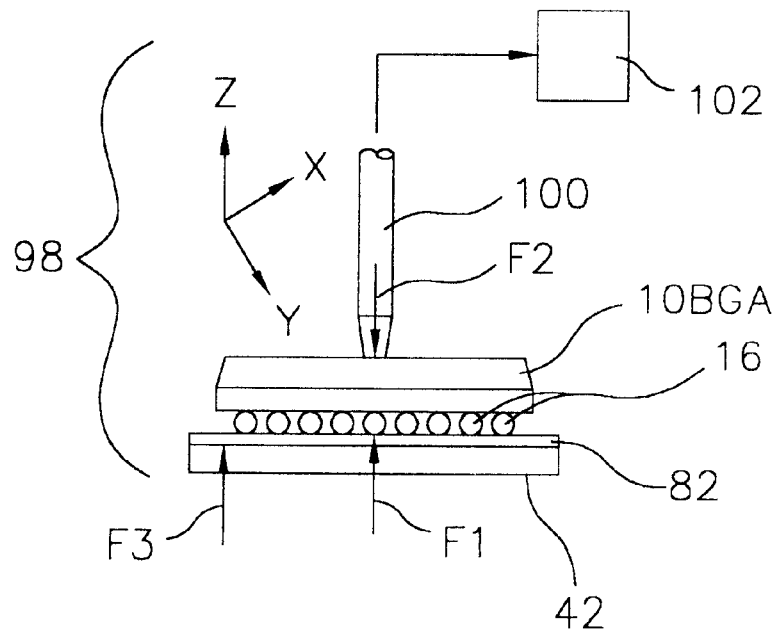
FIG. 9A is a schematic diagram of a semiconductor handling system constructed in accordance with the invention illustrating a component being removed from a carrier.
Figure 9B:
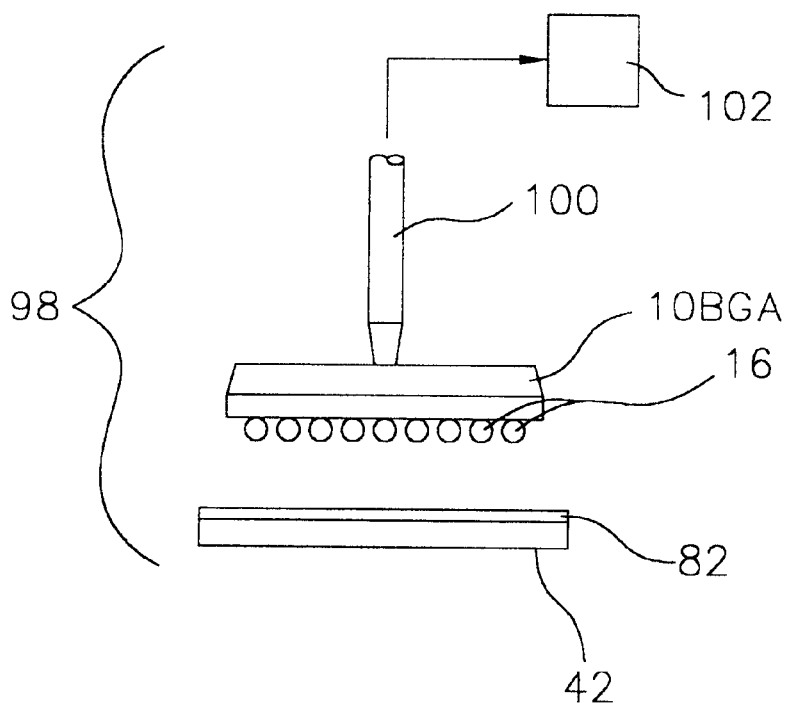
FIG. 9B is a schematic diagram of the system following removal of the component from the carrier.

Referring to FIGS. 9A and 9B, a semiconductor handling system 98 employing the carrier 42 is illustrated. In this system 98 the component comprises a BGA device 10BGA having contact balls 16 placed directly on the adhesive member 82. The BGA device 10BGA has been previously assembled on the carrier 42, such that an adhesive force F1 is exerted by the adhesive member 82 on the BGA device 10BGA. In addition, an adhesive force F3 is exerted by the adhesive member 82 on the carrier 42. As previously explained F3 is greater that F1.

The semiconductor handling system 98 includes a pick and place vacuum tool 100 in flow communication with a vacuum source 102. The pick and place vacuum tool 100 is movable in X, Y and Z directions, and is configured to exert a force F2 on the BGA device 10BGA. The force F2 exerted on the BGA device 10BGA by the pick and place vacuum tool 100 is greater than the adhesive force F1 exerted by the adhesive member 82 on the BGA device 10BGA, but less than the adhesive force F3 exerted by the adhesive member 82 on the carrier 42. As shown in FIG. 9B, this allows the tool 100 to pull the BGA device 10BGA from the adhesive layer 82, but without pulling the adhesive member 82 from the carrier 42.

The relationship between the forces can be expressed by the formula F3>F2>F1. By way of example, F3 can be from 2× to 5× of F2, while F1 can be from 20% to 50% of F2.

Thus the invention provides an improved carrier for semiconductor components, and an improved method and system for handling semiconductor components. Although the invention has been described with reference to certain preferred embodiments, as will be apparent to those skilled in the art, certain changes and modifications can be made without departing from the scope of the invention as defined by the following claims.

I claim:

1. A carrier for handling and transporting semiconductor components comprising:

a frame comprising a plurality of component mounting sites comprising pockets; and an adhesive member on each component mounting site comprising a polymer tape having a first adhesive surface comprising a low tack repositionable adhesive configured to exert a first adhesive force on a component for retaining the component on the frame, and a second adhesive surface comprising a high tack adhesive configured to exert a second adhesive force on the frame for bonding the adhesive member to the frame, the first adhesive force being less than the second adhesive force and selected to prevent movement of the component on the frame during handling and transport of the frame but to permit removal of the component from the frame by a tool as the adhesive member remains bonded to the frame.

2. The carrier of claim 1 wherein the component comprises a plurality of contact balls and the adhesive member is configured to contact at least some of the contact balls.

3. The carrier of claim 1 wherein the component comprises a planar surface and the adhesive member has a geometrical shape corresponding to the planar surface.

4. The carrier of claim 1 wherein the adhesive member has a particular geometrical configuration for contacting a selected surface or a selected feature on the component.

5. The carrier of claim 1 wherein the component comprises a plurality of leads and the adhesive member is configured to contact the leads.

6. A carrier for handling and transporting a semiconductor component having a plurality of leads comprising:

a frame comprising a pocket; and an adhesive member in the pocket capable of multiple uses comprising a polymer tape having a first adhesive surface comprising a low tack adhesive for retaining the component in the pocket, and a second adhesive surface comprising a high tack adhesive for attaching the polymer tape to the frame;

the low tack adhesive configured to contact the leads on the component to apply a first adhesive force to the component that is selected to retain and prevent movement of the component in the pocket in X, Y and Z directions during handling and transport of the frame but to permit removal of the component from the pocket during application of a force on the component by a tool;

the high tack adhesive configured to apply a second adhesive force to the frame selected to prevent removal of the polymer tape from the pocket during application of the force by the tool.

7. The carrier of claim 6 wherein the leads comprise a plurality of contact balls and the low tack adhesive contacts the contact balls.

8. The carrier of claim 6 wherein the leads comprise j-bend leads.

9. The carrier of 6 wherein the frame is configured for use with magazines or conveyors.

10. The carrier of claim 6 wherein the low tack adhesive comprises a repositionable adhesive.

11. A carrier for handling and transporting semiconductor components comprising:

a frame comprising a plurality of component mounting sites comprising pockets; and an adhesive member on each component mounting site comprising a length of polymer tape having a first adhesive surface comprising a repositionable adhesive capable of multiple uses and configured to retain a component on the frame, to prevent movement of the component on the frame in X, Y and Z directions during handling and transport of the frame, and to permit removal of the component from the frame by a tool, and a second adhesive surface configured to retain the adhesive member on the frame during handling and transport of the frame and during removal of the component from the frame;

the first adhesive surface having an adhesive quality, a geometrical shape, a position on the frame and a surface area selected to exert a first adhesive force on the component; and the second adhesive surface configured to exert a second adhesive force on the frame greater than the first adhesive force.

12. The carrier of claim 11 wherein the second adhesive surface comprises a pressure sensitive adhesive, a temperature sensitive adhesive or a curable adhesive.

13. The carrier of claim 11 wherein the component comprises a plurality of leads and the adhesive member contacts the leads.

14. The carrier of claim 11 wherein the component comprises a plurality of contact balls and the adhesive member contacts the contact balls.

15. The carrier of claim 11 wherein the component comprises a plurality of j-bend leads and the adhesive member contacts the j-bend leads.

16. The carrier of claim 11 wherein the component mounting sites are configured to retain the component in a selected position.

17. The carrier of claim 11 wherein the adhesive members have a size and shape corresponding to the component.

18. A carrier for handling and transporting semiconductor components comprising:

a frame comprising a plurality of component mounting sites comprising pockets; and an adhesive member on each component mounting site comprising a length of polymer tape having a first adhesive layer configured to retain a component and a second adhesive layer attached to the frame;

the first adhesive layer comprising a repositionable adhesive capable of multiple uses and having first adhesive qualities and a first contact area with the component selected to provide a first adhesive force, the first adhesive layer sufficient to retain the component on the frame, to prevent movement of the component on the frame in X, Y and Z directions during transport and handling of the frame, and to permit removal of the component from the frame by a tool, the second adhesive layer comprising a pressure sensitive adhesive, a temperature sensitive adhesive or a curable adhesive having second adhesive qualities and a second contact area with the frame selected to provide a second adhesive force sufficient to retain the adhesive member on the frame during removal of the component by the tool.

19. The carrier of claim 18 wherein the second adhesive force is several times greater than the first adhesive force.

20. The carrier of claim 18 wherein the adhesive member has a particular geometrical configuration for contacting selected surfaces or selected features on the components.

21. The carrier of claim 18 wherein the frame is constructed according to standards of an industry setting body.

22. The carrier of claim 18 wherein the component mounting sites have a high density configuration.

23. The carrier of claim 18 wherein the component mounting sites have a low density configuration.

24. A carrier for handling and transporting a semiconductor component comprising:

a frame comprising a component mounting site comprising a pocket having a surface with a plurality of features thereon configured to increase a surface area of the surface;

an adhesive member on the surface comprising a low tack repositionable adhesive material capable of multiple uses and configured to exert a first adhesive force on the component for retaining the component on the mounting site and for preventing movement of the component on the frame during handling and transport thereof, the adhesive member having an inner surface in contact with the features and configured to exert a second adhesive force on the surface of the component mounting site for attaching the adhesive member to the frame.

25. The carrier of claim 24 wherein the features comprise indentations, ridges, serrations or embossed members on the surface.

26. The carrier of claim 24 wherein the adhesive member comprises a cast material.

27. The carrier of claim 24 wherein the adhesive member comprises a sprayed material.

28. A carrier for handling and transporting a semiconductor component comprising:

a frame comprising a component mounting site comprising a pocket having a surface with a primer layer thereon;

an adhesive member on the primer layer comprising a low tack repositionable adhesive material capable of multiple uses and configured to exert a first adhesive force on the component for retaining the component on the mounting site and for preventing movement of the component on the frame during handling and transport thereof, the adhesive member having an inner surface in contact with the primer layer and configured to exert a second adhesive force for attaching the adhesive member to the frame.

29. The carrier of claim 28 wherein the second adhesive force is from about 2 to 5 times greater than the first adhesive force.

* * * * *